United States Patent
Yang et al.

(10) Patent No.: US 12,477,695 B2
(45) Date of Patent: Nov. 18, 2025

(54) TWO-PHASE IMMERSION-COOLING HEAT-DISSIPATION STRUCTURE HAVING SKIVED FINS

(71) Applicant: AMULAIRE THERMAL TECHNOLOGY, INC., New Taipei (TW)

(72) Inventors: Ching-Ming Yang, New Taipei (TW); Chun-Te Wu, New Taipei (TW); Tze-Yang Yeh, New Taipei (TW); Yu-Wei Chiu, New Taipei (TW)

(73) Assignee: AMULAIRE THERMAL TECHNOLOGY, INC., New Taipei (TW)

( * ) Notice: Subject to any disclaimer, the term of this patent is extended or adjusted under 35 U.S.C. 154(b) by 157 days.

(21) Appl. No.: 18/104,839

(22) Filed: Feb. 2, 2023

(65) Prior Publication Data
US 2024/0268078 A1 Aug. 8, 2024

(51) Int. Cl.
*H05K 7/20* (2006.01)
*H01L 23/367* (2006.01)
*H01L 23/427* (2006.01)

(52) U.S. Cl.
CPC ..... *H05K 7/20418* (2013.01); *H01L 23/3672* (2013.01); *H01L 23/427* (2013.01); *H05K 7/20236* (2013.01)

(58) Field of Classification Search
CPC ............ H05K 7/20418; H05K 7/20236; H01L 23/3672; H01L 23/427
See application file for complete search history.

(56) References Cited

U.S. PATENT DOCUMENTS 3,195,628 A * 7/1965 Mcadam .................. H01J 5/08
  257/E23.083
3,212,569 A * 10/1965 Mcadam ............. H01L 23/4006
  257/E23.083

(Continued)

FOREIGN PATENT DOCUMENTS

CN 215572293 U 1/2022
EP 4068350 A1 * 10/2022 ......... H05K 7/20236

(Continued)

*Primary Examiner* — Ljiljana V. Ciric
(74) *Attorney, Agent, or Firm* — Li & Cai Intellectual Property (USA) Office

(57) ABSTRACT

A two-phase immersion-cooling heat-dissipation structure having skived fins includes an immersion-cooling substrate and a plurality of immersion-cooling fins. The immersion-cooling substrate has a top surface and a bottom surface that are opposite to each other, the bottom surface is used for contacting a heat-generating component immersed in a two-phase coolant, the top surface is connected with the plurality of immersion-cooling fins, the plurality of immersion-cooling fins include at least one skived fin integrally formed on the top surface of the immersion-cooling substrate, and the plurality of immersion-cooling fins are non-linearly arranged. A thickness of any one of the plurality of immersion-cooling fins ranges from 0.1 mm to 0.35 mm, a height of any one of the plurality of immersion-cooling fins ranges from 5 mm to 10 mm, and a gap between any two of the plurality of immersion-cooling fins ranges from 0.1 mm to 0.35 mm.

8 Claims, 7 Drawing Sheets

(56) References Cited

U.S. PATENT DOCUMENTS

| | | | | | |
|---|---|---|---|---|---|
| 3,247,583 | A | * | 4/1966 | Hansson | B32B 37/06 |
| | | | | | 165/181 |
| 3,412,788 | A | * | 11/1968 | Pomerantz | H01L 24/01 |
| | | | | | 174/16.3 |
| 3,692,105 | A | * | 9/1972 | O'Connor | B21C 37/205 |
| | | | | | 165/181 |
| 3,746,086 | A | * | 7/1973 | Pasternak | B21D 53/02 |
| | | | | | 165/181 |
| 3,850,236 | A | * | 11/1974 | O'Connor | F28F 1/26 |
| | | | | | 165/181 |
| 3,866,286 | A | * | 2/1975 | Pasternak | B23P 15/26 |
| | | | | | 165/181 |
| 3,877,517 | A | * | 4/1975 | Pasternak | F28F 1/02 |
| | | | | | 165/172 |
| 3,886,639 | A | * | 6/1975 | Pasternak | B21J 5/068 |
| | | | | | 165/181 |
| 3,901,312 | A | * | 8/1975 | Pasternak | F28F 1/26 |
| | | | | | 165/181 |
| 3,947,941 | A | * | 4/1976 | O'Connor | B21J 5/068 |
| | | | | | 165/181 |
| 4,203,311 | A | * | 5/1980 | O'Connor | B21C 37/20 |
| | | | | | 72/368 |
| 4,340,902 | A | * | 7/1982 | Honda | H01L 23/49541 |
| | | | | | 174/547 |
| 4,369,833 | A | * | 1/1983 | Pasternak | F28F 1/12 |
| | | | | | 248/68.1 |
| 4,369,838 | A | * | 1/1983 | Asanuma | H01L 23/4006 |
| | | | | | 257/722 |
| 4,415,025 | A | * | 11/1983 | Horvath | H01L 23/433 |
| | | | | | 257/E23.09 |
| 4,611,238 | A | * | 9/1986 | Lewis | H01L 23/3672 |
| | | | | | 257/713 |
| 4,637,111 | A | * | 1/1987 | Pasternak | B21C 37/20 |
| | | | | | 165/181 |
| 4,794,985 | A | * | 1/1989 | Paulman | B21D 31/00 |
| | | | | | 165/172 |
| 5,168,348 | A | * | 12/1992 | Chu | H01L 23/4338 |
| | | | | | 257/713 |
| D348,252 | S | | 6/1994 | Mizunashi | D13/179 |
| 5,344,795 | A | * | 9/1994 | Hashemi | H01L 23/4334 |
| | | | | | 264/272.17 |
| 5,787,976 | A | * | 8/1998 | Hamburgen | H01L 23/3672 |
| | | | | | 257/E23.09 |
| 5,915,470 | A | * | 6/1999 | Dierbeck | F28F 3/048 |
| | | | | | 165/181 |
| 6,339,880 | B1 | * | 1/2002 | Ohta | H01L 23/3672 |
| | | | | | 257/E23.109 |
| 6,341,651 | B1 | * | 1/2002 | Ohta | B23P 15/26 |
| | | | | | 165/181 |
| 6,349,762 | B2 | * | 2/2002 | Ohta | B21J 5/068 |
| | | | | | 257/722 |
| 6,695,045 | B2 | * | 2/2004 | Chang | H01L 23/467 |
| | | | | | 174/16.3 |
| 6,845,647 | B2 | * | 1/2005 | Sun | B23P 15/26 |
| | | | | | 72/325 |
| 7,320,177 | B2 | * | 1/2008 | Miyahara | F28F 3/04 |
| | | | | | 257/E23.103 |
| 7,408,777 | B2 | * | 8/2008 | Jeong | H05K 7/20963 |
| | | | | | 174/16.3 |
| 7,969,740 | B2 | * | 6/2011 | Miyahara | B21J 5/068 |
| | | | | | 428/615 |
| 8,387,247 | B2 | * | 3/2013 | Miyahara | H01L 21/4878 |
| | | | | | 72/332 |
| 9,007,772 | B2 | * | 4/2015 | Liu | H01L 21/4882 |
| | | | | | 361/709 |
| 9,468,133 | B2 | * | 10/2016 | Blomberg | H01L 23/427 |
| 10,449,595 | B2 | | 10/2019 | Otsubo | B21D 53/022 |
| 11,031,312 | B2 | * | 6/2021 | Poltorak | H05K 7/20154 |
| 11,092,391 | B2 | * | 8/2021 | Kandlikar | H01L 23/44 |
| 11,096,313 | B2 | * | 8/2021 | Amos | H05K 7/20772 |
| 11,168,924 | B2 | * | 11/2021 | Naicker | F24H 9/1872 |
| 11,369,040 | B2 | * | 6/2022 | Amos | H05K 7/20781 |
| 11,470,739 | B2 | * | 10/2022 | Amos | H01L 23/3677 |
| 11,490,546 | B2 | * | 11/2022 | Edmunds | H05K 7/20772 |
| 11,596,082 | B2 | * | 2/2023 | Amos | H05K 7/20263 |
| 11,653,472 | B2 | * | 5/2023 | Amos | H01L 23/473 |
| | | | | | 361/699 |
| 11,670,564 | B2 | * | 6/2023 | Poltorak | H05K 7/20154 |
| | | | | | 165/281 |
| 11,761,719 | B1 | * | 9/2023 | Yang | H05K 7/20809 |
| | | | | | 165/80.4 |
| 11,906,218 | B2 | * | 2/2024 | Shedd | F25B 23/006 |
| 11,963,338 | B2 | * | 4/2024 | Edmunds | H05K 7/20772 |
| 11,968,802 | B2 | * | 4/2024 | Amos | H01L 23/3677 |
| 12,050,061 | B2 | * | 7/2024 | Kang | H01L 23/3733 |
| 12,108,574 | B2 | * | 10/2024 | Wu | H05K 7/2039 |
| 12,156,376 | B2 | * | 11/2024 | Yang | H05K 7/2039 |
| 12,178,006 | B2 | * | 12/2024 | Chen | H05K 7/20809 |
| 12,209,821 | B2 | * | 1/2025 | Chen | H05K 7/20809 |
| 12,288,731 | B2 | * | 4/2025 | Poltorak | H01L 23/473 |
| 12,396,131 | B2 | * | 8/2025 | Yang | H05K 7/203 |
| 2001/0030039 | A1 | * | 10/2001 | Copeland | F28F 3/048 |
| | | | | | 165/185 |
| 2002/0189790 | A1 | * | 12/2002 | Wong | B23P 15/26 |
| | | | | | 165/905 |
| 2004/0187307 | A1 | * | 9/2004 | Wong | F28F 3/022 |
| | | | | | 257/E23.103 |
| 2005/0195569 | A1 | * | 9/2005 | Hsu | H01L 23/427 |
| | | | | | 361/697 |
| 2009/0262502 | A1 | * | 10/2009 | Xu | H01L 23/367 |
| | | | | | 361/701 |
| 2010/0175852 | A1 | * | 7/2010 | Peterson | H05K 7/20809 |
| | | | | | 165/80.2 |
| 2014/0301031 | A1 | * | 10/2014 | Louvar | G06F 1/185 |
| | | | | | 165/80.4 |
| 2015/0062806 | A1 | * | 3/2015 | Shelnutt | H05K 7/20318 |
| | | | | | 361/679.53 |
| 2016/0120019 | A1 | * | 4/2016 | Shedd | F25B 41/40 |
| | | | | | 361/679.47 |
| 2016/0120059 | A1 | * | 4/2016 | Shedd | F28F 3/12 |
| | | | | | 165/244 |
| 2017/0105313 | A1 | * | 4/2017 | Shedd | H05K 7/20309 |
| 2019/0264986 | A1 | | 8/2019 | Chen et al. | |
| 2022/0201896 | A1 | * | 6/2022 | Edmunds | H05K 7/20263 |
| 2022/0344237 | A1 | * | 10/2022 | Deng | H01L 23/3736 |
| 2023/0240042 | A1 | * | 7/2023 | Amos | H01L 23/3677 |
| 2024/0142181 | A1 | * | 5/2024 | Wu | F28F 21/084 |
| 2024/0153846 | A1 | * | 5/2024 | Bodla | G06F 1/20 |
| 2024/0155809 | A1 | * | 5/2024 | Wu | H05K 7/203 |
| 2024/0175611 | A1 | * | 5/2024 | Shedd | H05K 7/20772 |
| 2024/0266252 | A1 | * | 8/2024 | Jeon | H01L 23/49 |
| 2024/0268078 | A1 | * | 8/2024 | Yang | H01L 23/427 |
| 2024/0280332 | A1 | * | 8/2024 | Chiu | H05K 7/203 |
| 2025/0071937 | A1 | * | 2/2025 | Zakaib | H01L 23/473 |
| 2025/0089209 | A1 | * | 3/2025 | Lin | H01L 23/427 |
| 2025/0172353 | A1 | * | 5/2025 | Chen | F28F 3/12 |

FOREIGN PATENT DOCUMENTS

| | | | | | |
|---|---|---|---|---|---|
| IL | | 308679 A | * | 1/2024 | H05K 7/20781 |
| JP | | H0273697 A | * | 3/1990 | F28F 3/022 |
| WO | WO-2022187106 A1 | | * | 9/2022 | H01L 23/473 |

* cited by examiner

TWO-PHASE IMMERSION-COOLING HEAT-DISSIPATION STRUCTURE HAVING SKIVED FINS

FIELD OF THE DISCLOSURE

The present disclosure relates to a heating-dissipation structure, and more particularly to a two-phase immersion-cooling heat-dissipation structure having skived fins.

BACKGROUND OF THE DISCLOSURE

Two-phase immersion-cooling technology is to directly immerse heat-generating components such as server motherboards, disk arrays, etc., in non-conductive two-phase coolant. In the process, the heat energy generated by the operation of the heat-generating component is absorbed and vaporized by the two-phase coolant. However, how to dissipate heat more effectively through the two-phase immersion-cooling technology has long been an issue to be addressed in the relevant industry.

SUMMARY OF THE DISCLOSURE

In response to the above-referenced technical inadequacies, the present disclosure provides a two-phase immersion-cooling heat-dissipation structure having skived fins.

A two-phase immersion-cooling heat-dissipation structure having skived fins is provided, comprising an immersion-cooling substrate and a plurality of immersion-cooling fins. The immersion-cooling substrate has a top surface and a bottom surface that are opposite to each other, the bottom surface is used for contacting a heat-generating component immersed in a two-phase coolant, and the top surface is connected with the plurality of immersion-cooling fins. The plurality of immersion-cooling fins include at least one skived fin integrally formed on the top surface of the immersion-cooling substrate, and the plurality of immersion-cooling fins are non-linearly arranged. A thickness of any one of the plurality of immersion-cooling fins ranges from 0.1 mm to 0.35 mm, a height of any one of the plurality of immersion-cooling fins ranges from 5 mm to 10 mm, and a gap between any two of the plurality of immersion-cooling fins ranges from 0.1 mm to 0.35 mm.

In preferred embodiments, an included angle between a tangent line of any point on an outline of any one of the plurality of immersion-cooling fins and a direction perpendicular to an arrangement direction of the plurality of immersion-cooling fins is less than 45 degrees.

In preferred embodiments, a gap between at least two of the plurality of immersion-cooling fins is different from a gap between another two of the plurality of immersion-cooling fins.

In preferred embodiments, the plurality of immersion-cooling fins are made of one of copper and copper alloy.

In preferred embodiments, the two-phase immersion-cooling heat-dissipation structure having skived fins further includes: a reinforced outer frame attached to the immersion-cooling substrate and surrounding at least a portion of the plurality of immersion-cooling fins.

In preferred embodiments, at least one of the immersion-cooling substrate and the reinforced outer frame is formed with a plurality of through holes, and a plurality of spring screws are configured to pass correspondingly through the plurality of through holes.

In preferred embodiments, the two-phase immersion-cooling heat-dissipation structure having skived fins further includes: a high thermal conductivity structure attached to a lower surface of the immersion-cooling substrate, such that the immersion-cooling substrate is in an indirect contact with the heat-generating component through the high thermal conductivity structure. A vacuum airtight cavity is formed inside the high thermal conductivity structure, and the vacuum airtight cavity contains liquid.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The described embodiments may be better understood by reference to the following description and the accompanying drawings, in which.

DETAILED DESCRIPTION OF THE EXEMPLARY EMBODIMENTS

Figure 1:
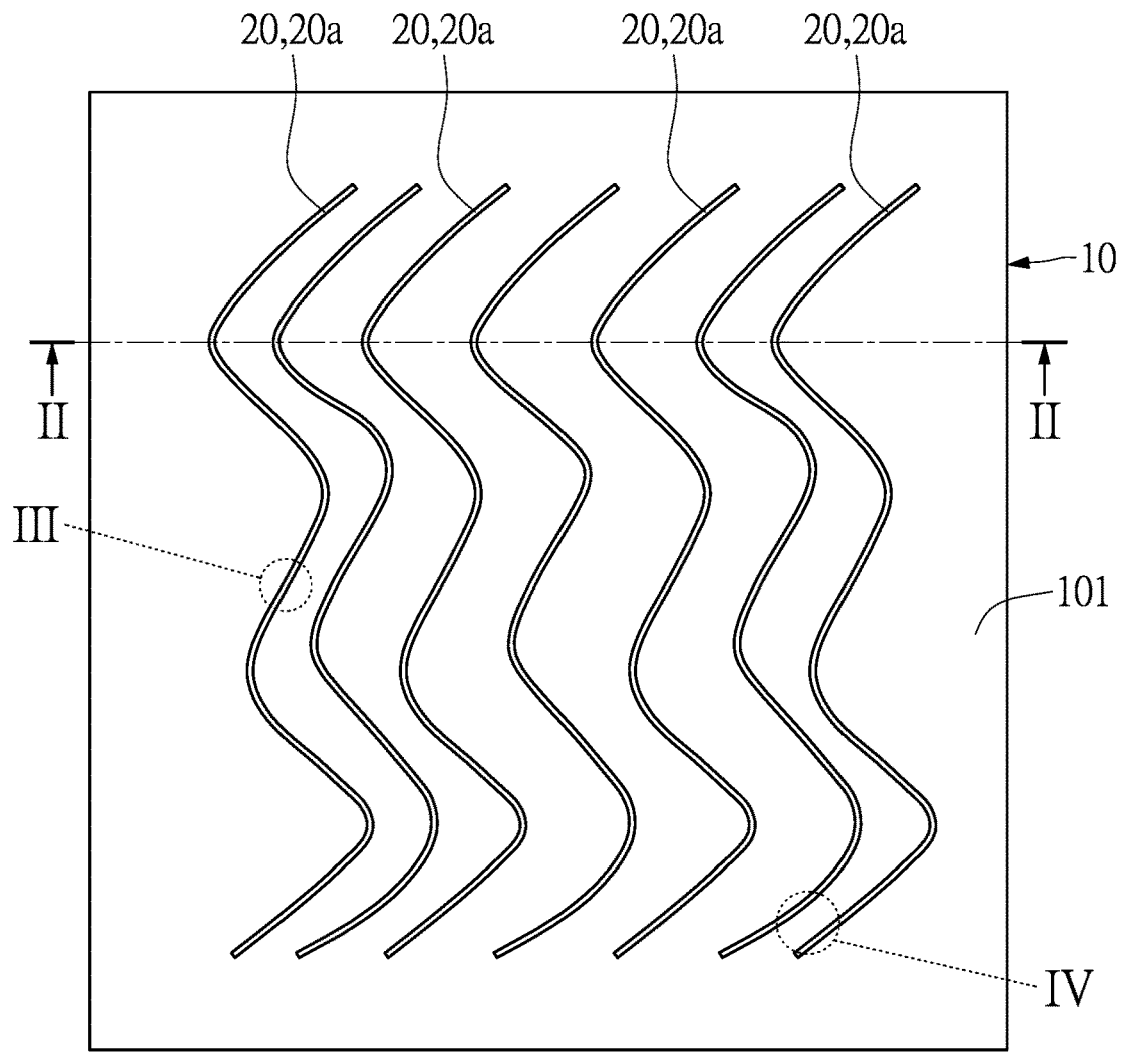
FIG. 1 is a schematic top view of a first embodiment of a two-phase immersion-cooling heat-dissipation structure having skived fins according to the present disclosure.
Figure 2:
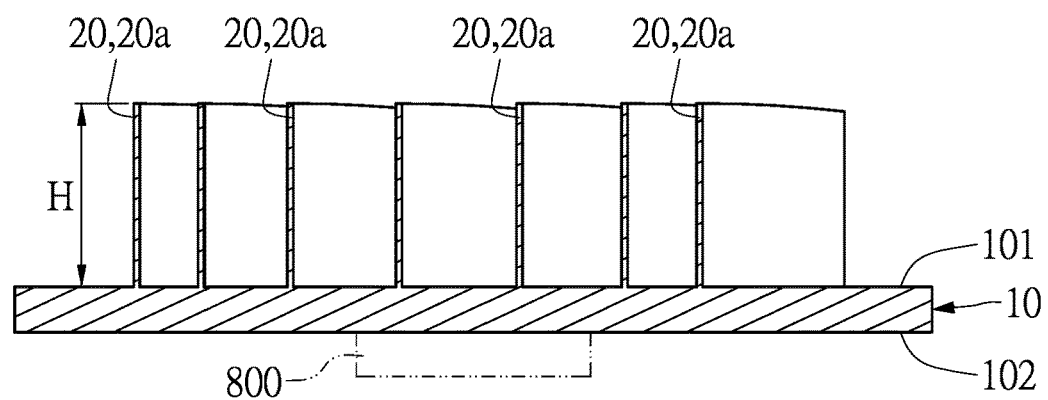
FIG. 2 is a schematic cross-sectional view taken along line II-II in FIG. 1.
Figure 3:
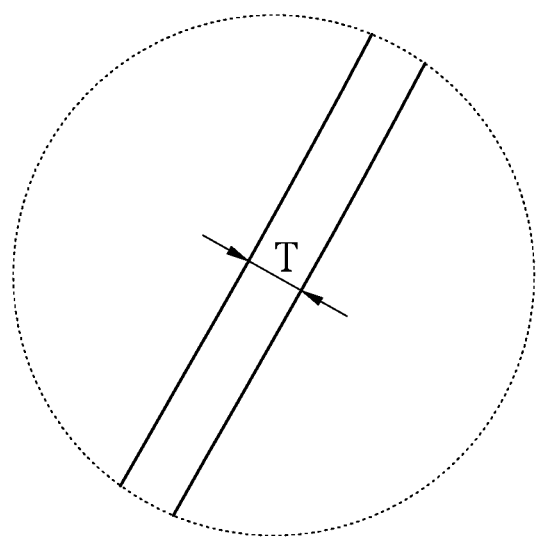
FIG. 3 is an enlarged schematic view of part III in FIG. 1.
Figure 4:
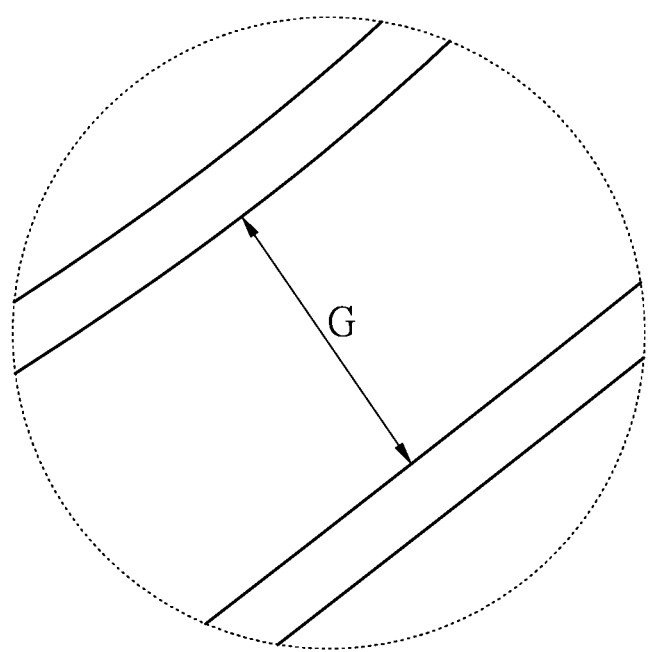
FIG. 4 is an enlarged schematic view of part IV in FIG. 1.

The present disclosure is more particularly described in the following embodiments that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

First Embodiment

Reference is made to FIG. 1 to FIG. 5, which refer to a first embodiment of the present disclosure. This embodiment of the present disclosure provides a two-phase immersion-cooling heat-dissipation structure having skived fins, which is used for contacting a heat-generating component immersed in a two-phase coolant. As shown in the figures, the two-phase immersion-cooling heat-dissipation structure having skived fins according to the embodiment of the present disclosure includes an immersion-cooling substrate 10 and a plurality of immersion-cooling fins 20.

In the present embodiment, the immersion-cooling substrate 10 can be made of high thermal conductivity materials, such as aluminum, copper or alloys thereof. The immersion-cooling substrate 10 can be a non-porous heat sink or a porous heat sink. Preferably, the immersion-cooling substrate 10 can be a porous metal heat sink having a porosity greater than 8% immersed in a two-phase coolant (such as a non-conductive electronic fluorinated liquid), and can be used to increase a generation of air bubbles to strengthen the immersion cooling effect.

In the present embodiment, the immersion-cooling substrate 10 has a top surface 101 and a bottom surface 102 that are opposite to each other. The bottom surface 102 is used for contacting a heat-generating component 800 immersed in a two-phase coolant, and the contact can be made directly or indirectly through an intermediate layer. The top surface 101 of the immersion-cooling substrate 10 is connected with the plurality of immersion-cooling fins 20, and the plurality of immersion-cooling fins 20 include at least one skived-fin 20a integrally formed on the top surface 101 of the immersion-cooling substrate 10 in a skiving manner.

Further, the plurality of immersion-cooling fins 20 are arranged in a non-linear arrangement, meaning that the projections of the plurality of immersion-cooling fins 20 on the top surface 101 of the immersion-cooling substrate 10 are not arranged in straight lines that are parallel to each other. Furthermore, an outline of the plurality of immersion-cooling fins 20 in the present embodiment is wave-shaped, and may be irregular in shape. At least half or all of the plurality of immersion-cooling fins 20 may be a skived-fin 20a. In this way, in the present embodiment, the outline of the plurality of immersion-cooling fins 20 is wave-shaped, and at least half or all of the plurality of immersion-cooling fins 20 are skived-fins 20a to increase an arrangement density, thereby obtaining a greater surface area to allow the bubbles to undergo nucleate boiling for enhancing the immersion-cooling effect.

A surface roughness of the plurality of immersion-cooling fins 20 in the present embodiment is Ra>1.5 μm. A thickness T of the plurality of immersion-cooling fins 20 ranges from 0.1 mm to 0.35 mm, and the thickness T refers to a central thickness of a single fin. A gap G between any two of the plurality of immersion-cooling fins 20 is between 0.1 mm to 0.35 mm, and the gap G refers to a shortest gap between a side of one of the plurality of immersion-cooling fins 20 and a side of an adjacent one of the plurality of immersion-cooling fins 20, and the gap G between at least two of the plurality of immersion-cooling fins 20 is different from the gap G between another two of the plurality of immersion-cooling fins 20. A height H of any of the plurality of immersion-cooling fins 20 is between 5 mm to 10 mm, and the height H refers to a vertical distance from the top surface 101 to a highest point of the plurality of immersion-cooling fins 20.

Figure 6:
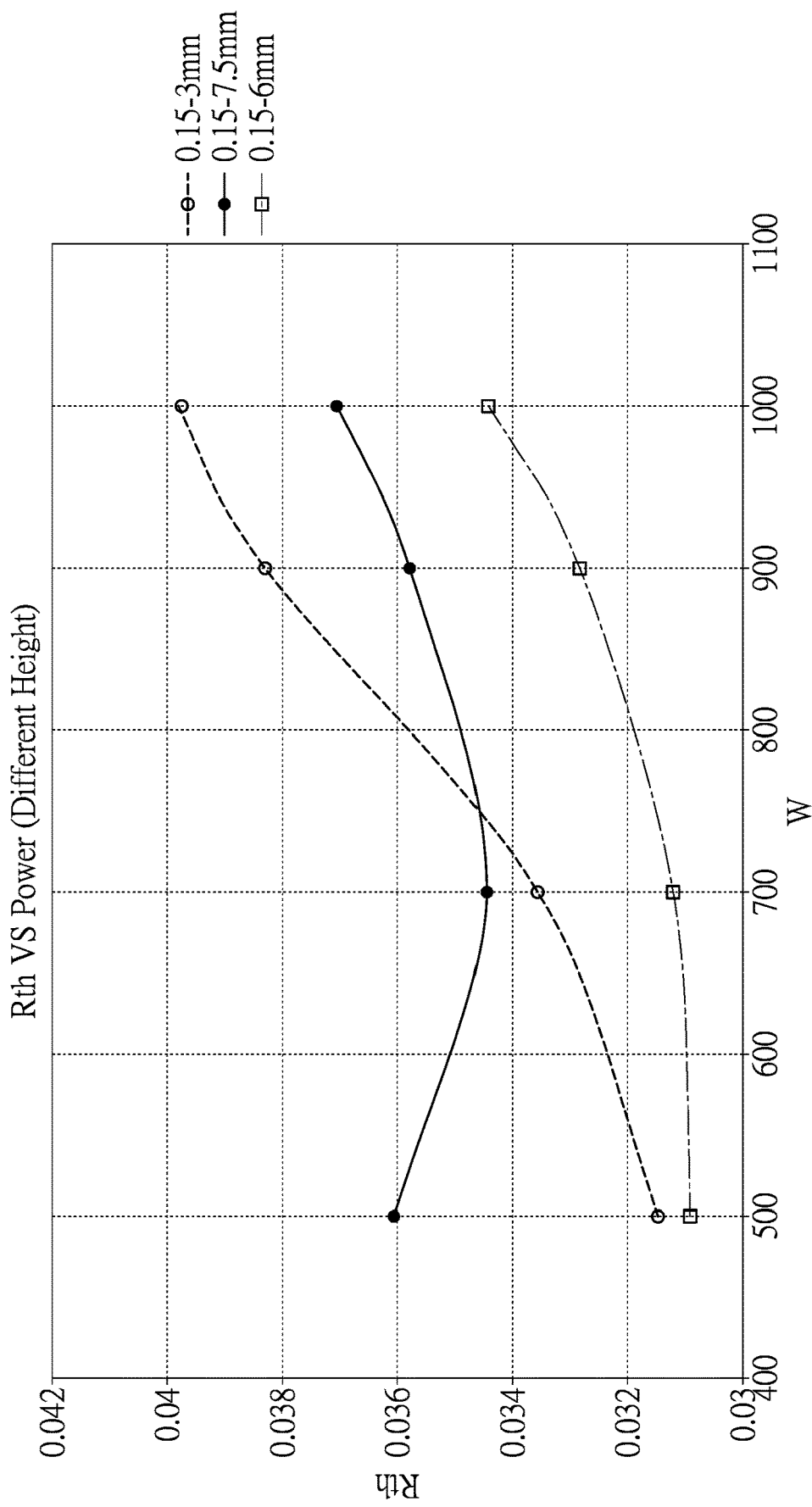
FIG. 6 is a measurement result of thermal resistance under different fin heights.
Figure 7:
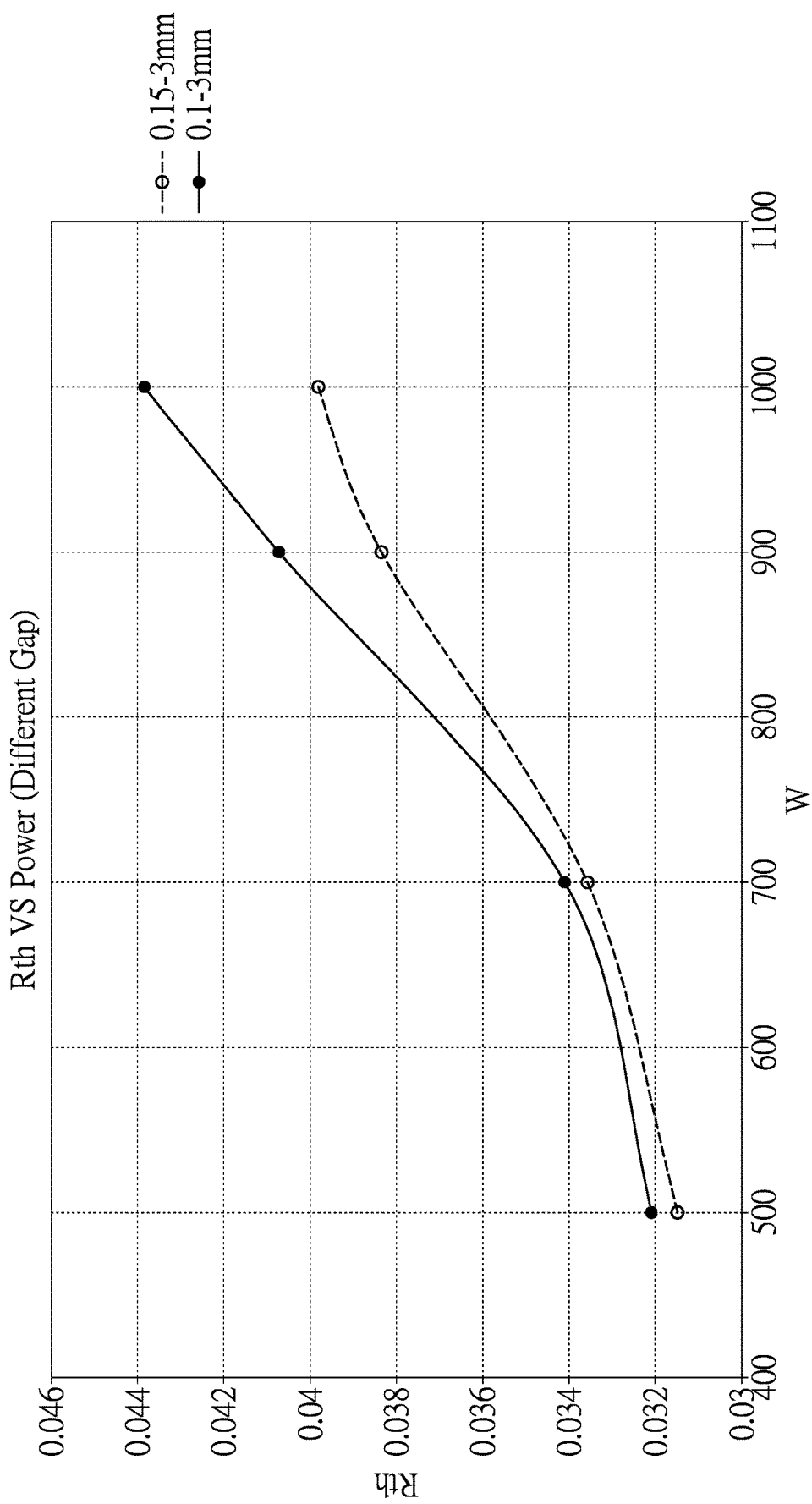
FIG. 7 is a measurement result of thermal resistance under different fin gaps.

It should be noted that although there may currently be similar types of fins available, these fins should be applicable toward two-phase immersion-cooling regardless of whether they are of the linear or nonlinear type. Further, a smaller gap is not always optimal (despite a smaller gap theoretically contributing to a larger surface area, which may enhance the heat-dissipation effect) and a higher height is also not always optimal (despite a higher height theoretically contributing to a larger surface area, which may enhance the heat-dissipation effect). The reason is that the heat transfer mechanism of the two-phase immersion cooling is different from the traditional heat transfer mechanism, such as water cooling or air cooling, which involves convection of the two-phase coolant and generation of air bubbles. The simulation of the heat transfer mechanism of two-phase immersion cooling has yet to be simulated by software having sufficient accuracy, as a huge database is additionally required, which signifies that the heat transfer mechanism of two-phase immersion cooling cannot be derived from the traditional heat transfer mechanism. Reference is made to FIG. 6 and FIG. 7. FIG. 6 shows the thermal resistance (Rth) measured under different powers (W) of the heat-generating component at different fin heights in a same fin area. FIG. 7 shows the thermal resistance (Rth) measured under different powers (W) of the heat-generating component with different fin gaps in a same fin area. The lower the measured thermal resistance is, the better the cooling effect is. Generally speaking, a smaller gap means a greater number of fins and a greater surface area within the fin area. However, it can be seen from the actual measurements that a larger surface area does not necessarily provide a better heat-dissipation effect.

Figure 5:
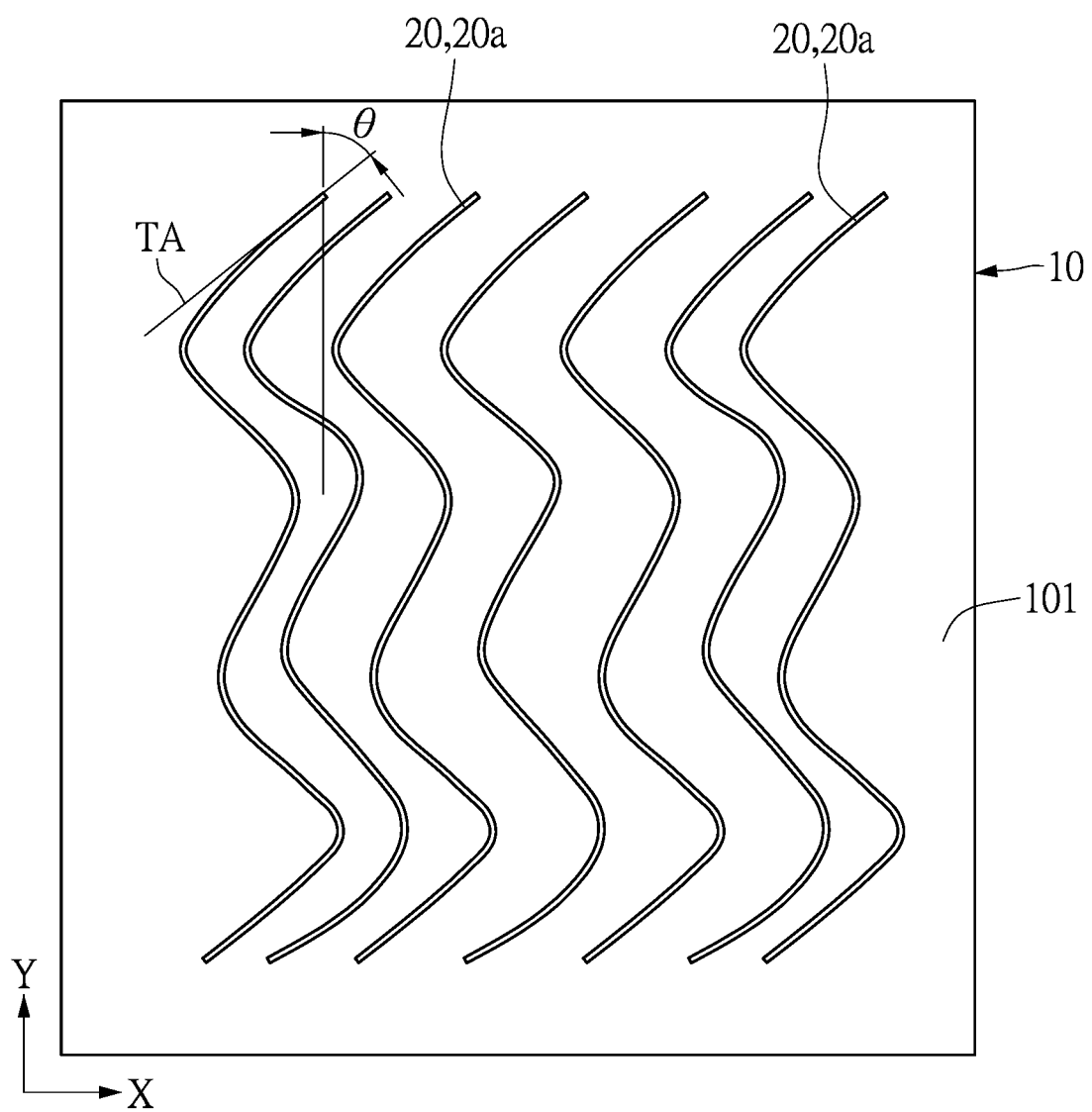
FIG. 5 is a schematic diagram of a tangent line in the first embodiment of the present disclosure.

In addition, if the plurality of immersion-cooling fins 20 of the present embodiment are found to be too curved through actual tests, a discharge of bubbles is affected, which in turn affects the immersion-cooling effect. Therefore, an included angle θ between a tangent line TA (as shown in FIG. 5) at any point on the outline of the plurality of immersion-cooling fins 20 and the direction (Y-axis direction) perpendicular to the arrangement direction (X-axis direction) of the plurality of immersion-cooling fins 20 needs to be smaller than 45 degrees, so as to really enhance the immersion-cooling effect.

Second Embodiment

Figure 8:
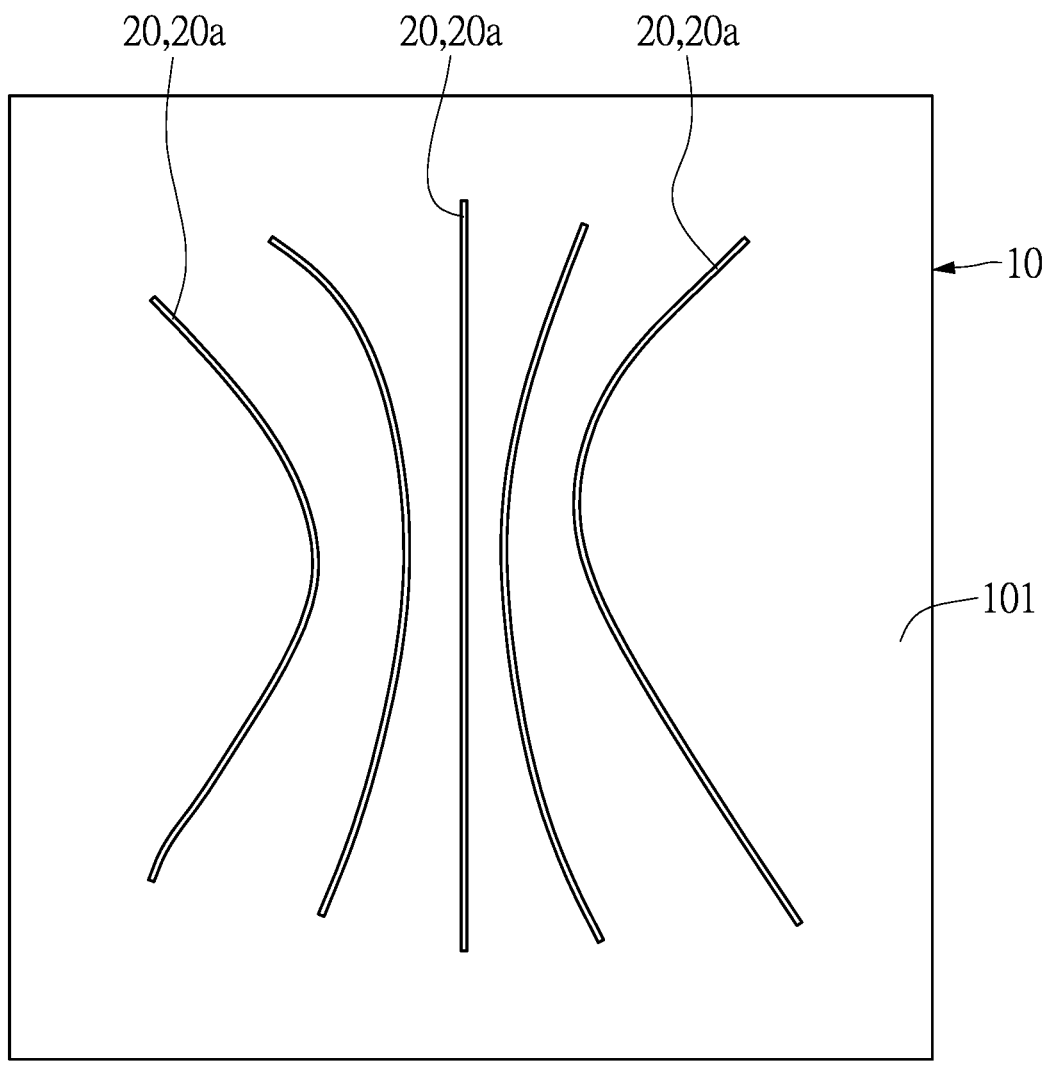
FIG. 8 is a schematic top view of a second embodiment of the present disclosure.

Reference is made to FIG. 8, which is a schematic top view of the second embodiment of the present disclosure.

The second embodiment is substantially the same as the first embodiment, and the differences are described as follows.

In the second embodiment, at least half or all of the plurality of immersion-cooling fins 20 are skived-fins 20a, at least half of the plurality of immersion-cooling fins 20 are curved, at least one of the plurality of immersion-cooling fins 20 is straight, and a gap between at least two of the plurality of immersion-cooling fins 20 is different from a gap between another two of the plurality of immersion-cooling fins 20.

Third Embodiment

Figure 9:
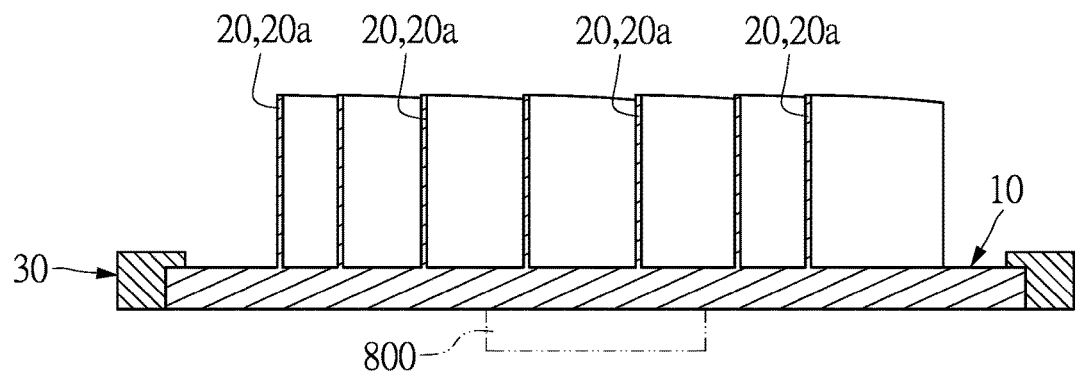
FIG. 9 is a schematic cross-sectional view of a third embodiment of the present disclosure.

Reference is made to FIG. 9, which is a schematic cross-sectional view of the third embodiment of the present disclosure. The third embodiment is substantially the same as the first embodiment, and the differences are described as follows.

In the third embodiment, the immersion-cooling substrate 10 is further combined with a reinforced outer frame 30, and the reinforced outer frame 30 surrounds at least a portion of the plurality of immersion-cooling fins 20, so as to reinforce the overall structural strength and avoid problems and damage caused by warping. The reinforced outer frame 30 can be made of aluminum alloy or stainless steel. Moreover, the reinforced outer frame 30 may be attached to the immersion-cooling substrate 10 by means of press fitting, welding, friction stir welding (FSW), adhesion, or diffusion bonding.

Fourth Embodiment

Figure 10:
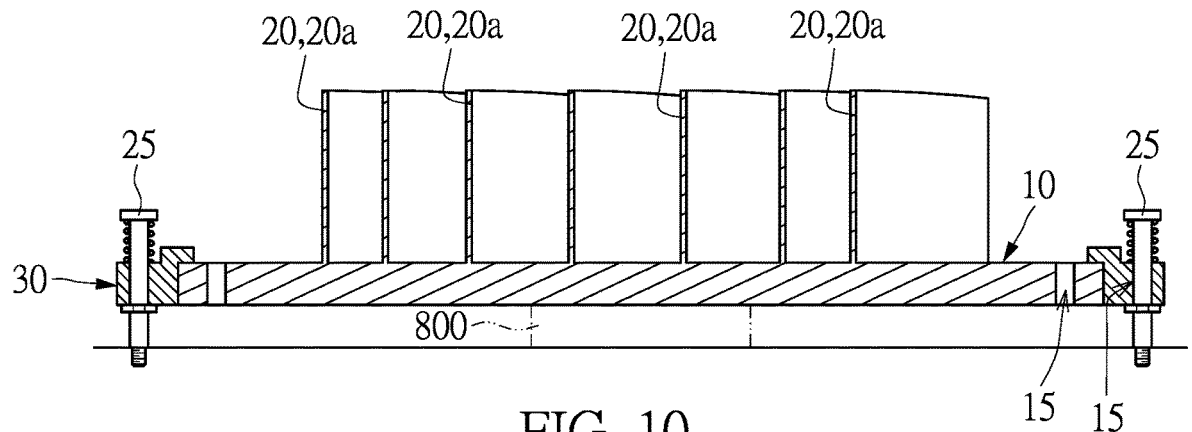
FIG. 10 is a schematic cross-sectional view of a fourth embodiment of the present disclosure.

Reference is made to FIG. 10, which is a schematic cross-sectional view of the fourth embodiment of the present disclosure.

The fourth embodiment is substantially the same as the first embodiment and the third embodiment, and the differences are described as follows.

In the fourth embodiment, a plurality of through holes 15 may be formed on two sides of the immersion-cooling substrate 10 or two sides of the reinforced outer frame 30, and a plurality of spring screws 25 may be configured to pass correspondingly through the plurality of through holes 15, so as to better fix the immersion-cooling substrate 10 or the reinforced outer frame 30 on a mainboard of the heat-generating component 800.

Fifth Embodiment

Figure 11:
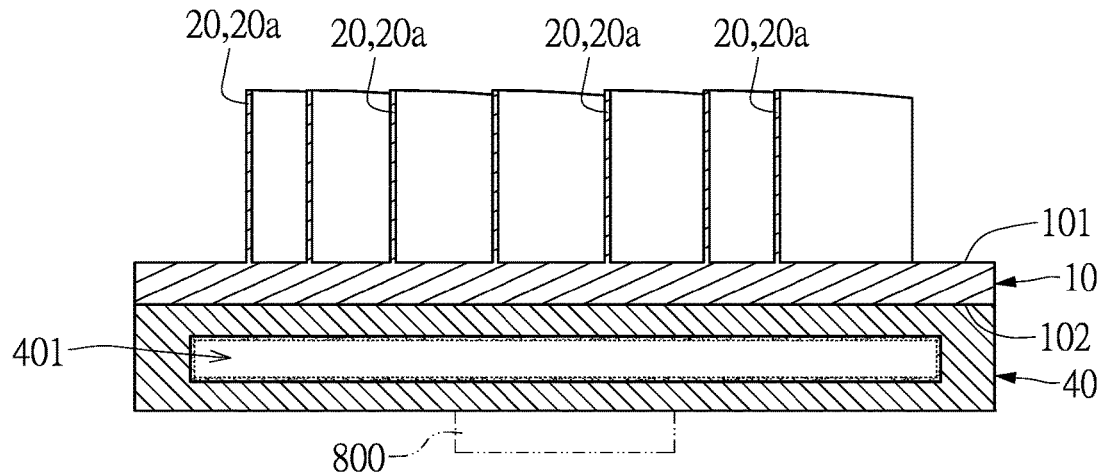
FIG. 11 is a schematic cross-sectional view of a fifth embodiment of the present disclosure.

Reference is made to FIG. 11, which is a schematic cross-sectional view of the fifth embodiment of the present disclosure.

The fifth embodiment is substantially the same as the first embodiment, and the differences are described as follows.

In the fifth embodiment, a high thermal conductivity structure 40 is further included. Moreover, the high thermal conductivity structure 40 is attached to the bottom surface 102 of the immersion-cooling substrate 10, such that the immersion-cooling substrate 10 is in an indirect contact with the heat-generating component 800 immersed in the two-phase coolant through the high thermal conductivity structure 40. More specifically, the high thermal conductivity structure 40 may be attached to the bottom surface 102 of the immersion-cooling substrate 10 through welding, friction stir bonding, adhesion, or diffusion bonding. In other embodiments, the immersion-cooling substrate 10 may be integrally formed with the high thermal conductivity structure 40.

Furthermore, a vacuum airtight cavity 401 is formed inside the high thermal conductivity structure 40, a sintered body can also be formed on a top wall and a bottom wall of the vacuum airtight cavity 401, and an appropriate amount of liquid is contained in the vacuum airtight cavity 401. The liquid may be water or acetone. Moreover, the bottom surface of the high thermal conductivity structure 40 can be used to contact the heat-generating component 800 immersed in the two-phase coolant, such that the heat energy generated by the heat-generating component 800 can be absorbed and vaporized through the two-phase coolant, and the high thermal conductivity structure 40 can contact and absorb the heat energy generated by the heating component 800. In this manner, the liquid in the vacuum airtight chamber 401 is vaporized and evaporated into steam and dissipated to the immersion-cooling substrate 10, and the heat energy is quickly transferred to the skived fins integrally formed with the immersion-cooling substrate 10 and arranged in a very high density. The heat energy absorbed by the skived fins is absorbed and vaporized through the two-phase coolant, and the steam in the vacuum airtight cavity 401 releases the heat energy such that the heat energy is condensed on the top wall of the vacuum airtight cavity 401 before returning to the bottom wall of the vacuum airtight cavity 401. Such a high-speed circulation can quickly release the heat energy generated by the heat-generating component 800, thereby enhancing the immersion heat-dissipation effect.

In summary, the two-phase immersion-cooling heat-dissipation structure having skived fins provided by the present disclosure can effectively enhance the overall immersion-cooling effect at least by virtue of "the immersion-cooling substrate having a top surface and a bottom surface that are opposite to each other", "the bottom surface of the immersion-cooling substrate being used for contacting a heat-generating component immersed in a two-phase coolant, the top surface of the immersion-cooling substrate being connected with the plurality of immersion-cooling fins", "the plurality of immersion-cooling fins including at least one skived fin integrally formed on the top surface of the immersion-cooling substrate, and the plurality of immersion-cooling fins being non-linearly arranged", and "a thickness of any one of the plurality of immersion-cooling fins ranging from 0.1 mm to 0.35 mm, a height of any one of the plurality of immersion-cooling fins ranging from 5 mm to 10 mm, and a gap between any two of the plurality of immersion-cooling fins ranging from 0.1 mm to 0.35 mm".

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A two-phase immersion-cooling heat-dissipation structure having skived fins, comprising:
    an immersion-cooling substrate and a plurality of immersion-cooling fins,
        wherein the immersion-cooling substrate has a top surface and a bottom surface that are opposite to each other, the bottom surface of the immersion-cooling substrate is used for contacting a heat-generating component immersed in a two-phase coolant, the top surface of the immersion-cooling substrate is connected with the plurality of immersion-cooling fins, the plurality of immersion-cooling fins include at least one skived fin integrally formed on the top surface of the immersion-cooling substrate, the plurality of immersion-cooling fins are non-linearly arranged, and wherein a thickness of any one of the plurality of immersion-cooling fins ranges from 0.1 mm to 0.35 mm, a height of any one of the plurality of immersion-cooling fins ranges from 5 mm to 10 mm, and a gap between any two of the plurality of immersion-cooling fins ranges from 0.1 mm to 0.35 mm.

2. The two-phase immersion-cooling heat-dissipation structure having skived fins according to claim 1, wherein an included angle between a tangent line of any point on an outline of any one of the plurality of immersion-cooling fins and a direction perpendicular to an arrangement direction of the plurality of immersion-cooling fins is less than 45 degrees.

3. The two-phase immersion-cooling heat-dissipation structure having skived fins according to claim 1, wherein a gap between at least two of the plurality of immersion-cooling fins is different from a gap between another two of the plurality of immersion-cooling fins.

4. The two-phase immersion-cooling heat-dissipation structure having skived fins according to claim 1, wherein the plurality of immersion-cooling fins are made of one of copper and copper alloy.

5. The two-phase immersion-cooling heat-dissipation structure having skived fins according to claim 1, wherein a surface roughness of each of the plurality of immersion-cooling fins is Ra>1.5 μm.

6. The two-phase immersion-cooling heat-dissipation structure having skived fins according to claim 1, further including: a reinforced outer frame attached to the immersion-cooling substrate and surrounding at least a portion of the plurality of immersion-cooling fins.

7. The two-phase immersion-cooling heat-dissipation structure having skived fins according to claim 6, wherein at least one of the immersion-cooling substrate and the reinforced outer frame is formed with a plurality of through holes, and a plurality of spring screws are configured to pass correspondingly through the plurality of through holes.

8. The two-phase immersion-cooling heat-dissipation structure having skived fins according to claim 1, further including: a high thermal conductivity structure attached to the bottom surface of the immersion-cooling substrate, such that the immersion-cooling substrate is in an indirect contact with the heat-generating component through the high thermal conductivity structure, and wherein an airtight vacuum cavity is formed inside the high thermal conductivity structure, and the vacuum airtight cavity contains liquid.

\* \* \* \* \*